(12) United States Patent
Nakakubo et al.

(10) Patent No.: US 9,312,306 B2
(45) Date of Patent: Apr. 12, 2016

(54) NONVOLATILE MEMORY DEVICE AND METHOD OF MANUFACTURING THE SAME

(71) Applicant: Kabushiki Kaisha Toshiba, Minato-ku (JP)

(72) Inventors: Yoshinori Nakakubo, Yokkaichi (JP); Shigeki Kobayashi, Kuwana (JP); Takeshi Yamaguchi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/165,956

(22) Filed: Jan. 28, 2014

(65) Prior Publication Data

US 2015/0060749 A1 Mar. 5, 2015

Related U.S. Application Data

(60) Provisional application No. 61/873,025, filed on Sep. 3, 2013.

(51) Int. Cl.
*H01L 27/24* (2006.01)
*H01L 45/00* (2006.01)

(52) U.S. Cl.
CPC ........ *H01L 27/2463* (2013.01); *H01L 27/2436* (2013.01); *H01L 45/04* (2013.01); *H01L 45/1233* (2013.01); *H01L 45/146* (2013.01); *H01L 45/147* (2013.01); *H01L 45/1683* (2013.01)

(58) Field of Classification Search
CPC combination set(s) only.
See application file for complete search history.

(56) References Cited

U.S. PATENT DOCUMENTS

| | | | |
|---|---|---|---|
| 2005/0073024 A1* | 4/2005 | Frey et al. | 257/530 |
| 2006/0050549 A1 | 3/2006 | Adachi et al. | |
| 2007/0138576 A1* | 6/2007 | Mizukami et al. | 257/390 |
| 2009/0137112 A1* | 5/2009 | Tabata et al. | 438/631 |
| 2010/0283028 A1 | 11/2010 | Brubaker et al. | |
| 2010/0301330 A1 | 12/2010 | Ho et al. | |
| 2011/0069531 A1* | 3/2011 | Aburada et al. | 365/148 |
| 2011/0089474 A1* | 4/2011 | Fukutome | 257/288 |
| 2012/0195100 A1* | 8/2012 | Saitoh et al. | 365/148 |
| 2014/0284728 A1* | 9/2014 | Wu et al. | 257/412 |

FOREIGN PATENT DOCUMENTS

| | | |
|---|---|---|
| JP | 2010-522424 | 7/2010 |
| WO | WO 2006/013819 A1 | 2/2006 |

* cited by examiner

*Primary Examiner* — Kyoung Lee
*Assistant Examiner* — Ratisha Mehta
(74) *Attorney, Agent, or Firm* — Oblon, McClelland, Maier & Neustadt, L.L.P

(57) ABSTRACT

According to an embodiment, a first impurity diffusion layer is provided in a region lower than a drain region and the first impurity diffusion layer diffuses impurities of a second conductivity type. A second impurity diffusion layer is provided between the drain region and the first impurity diffusion layer, and the second impurity diffusion layer diffuses impurities of a first conductivity type or the second conductivity type, and a concentration of the second impurity diffusion layer is lower than that of the first conductivity type of the drain region and that of the second conductivity type of the first impurity diffusion layer.

16 Claims, 11 Drawing Sheets

US 9,312,306 B2

NONVOLATILE MEMORY DEVICE AND METHOD OF MANUFACTURING THE SAME

CROSS-REFERENCE TO RELATED APPLICATIONS

This application is based upon and claims the benefit of priority from U.S. Provisional Application No. 61/873,025, filed on Sep. 3, 2013; the entire contents of which are incorporated herein by reference.

FIELD

Embodiments described herein relate generally to a nonvolatile memory device and a method of manufacturing the same.

BACKGROUND

In recent years, as a nonvolatile memory device, a Resistive Random Access Memory (ReRAM) is drawing attention. ReRAM stores resistant value information of a variable resistive element that can be electrically rewritten, for example a high resistance state and a low resistance state thereof in a nonvolatile manner. As such a ReRAM, for example, one with a structure in which memory cells are arranged in a matrix, where each memory cell is of 1 transistor-one Variable resistive element (Hereinbelow referred to as 1T1R) type configured by connecting a variable resistive element and a selection transistor in series, for example is known.

In a set process of the 1T1R type memory cell, the variable resistive element is caused to be at a low resistance by flowing current in the selection transistor, and in a reset process, the variable resistive element is caused to be at a high resistance by flowing current on a substrate side. However, during such a switching operation, a voltage drop occurs. Further, in order to be high integration, the voltage drop may become in a 1TnR type (n being a natural number of 2 or more).

DETAILED DESCRIPTION

In general, according to one embodiment, a nonvolatile memory device including a selection transistor, a memory cell, a first impurity diffusion layer, and a second impurity diffusion layer is provided. The selection transistor includes a gate electrode provided above a semiconductor substrate via a gate insulating film, and source/drain regions provided on both sides of a surface of the semiconductor substrate, sandwiching the gate electrode, and the source/drain regions diffuse impurities of a first conductivity type. The memory cell includes a variable resistive layer connected to a drain region of the selection transistor. The first impurity diffusion layer is provided in a region lower than the drain region, and the first impurity diffusion layer diffuses impurities of a second conductivity type. The second impurity diffusion layer is provided between the drain region and the first impurity diffusion layer, and the second impurity diffusion layer diffuses impurities of the first conductivity type or the second conductivity type, and a concentration of the second impurity diffusion layer is lower than that of the first conductivity type in the drain region and that of the second conductivity type in the first impurity diffusion layer.

Hereinbelow, a nonvolatile memory device and a method of manufacturing the same of embodiments are described in detail with reference to the attached drawings. Note that these embodiments do not limit the present invention. Further, cross sectional views of the nonvolatile memory device used in the below embodiments are schematic, and a relationship of thickness and width of layers, thickness ratio of the respective layers and the like differ from what they actually are. Further, hereinbelow, a ReRAM will be illustrated as an example of the nonvolatile memory device.

(First Embodiment)

Figure 1:
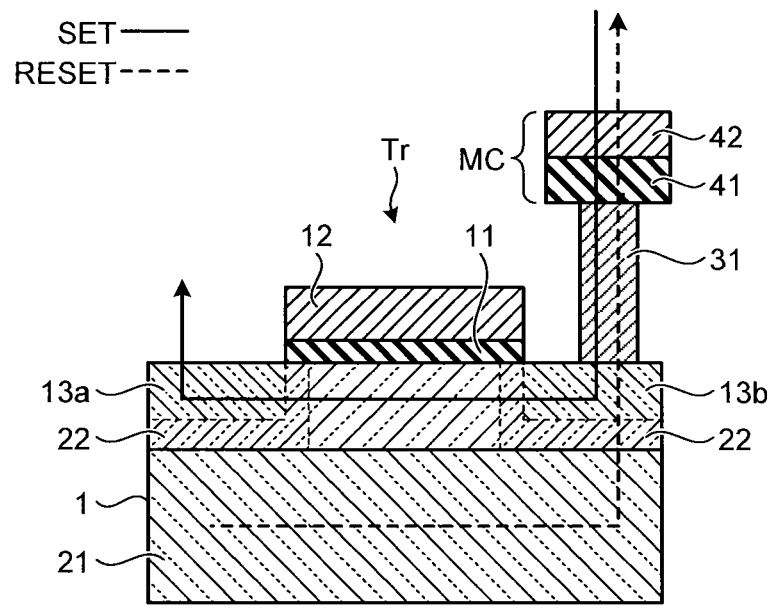
FIG. 1 is a cross sectional view schematically illustrating an example of a configuration of a nonvolatile memory device of a first embodiment.

FIG. 1 is a cross sectional view schematically illustrating an example of a configuration of a nonvolatile memory device of a first embodiment. A memory cell structure of a 1T1R type includes a selection transistor Tr disposed above a semiconductor substrate 1 such as a silicon substrate and the like.

The selection transistor Tr includes a gate structure in which a gate insulating film 11 and a gate electrode 12 are stacked on a channel region of the semiconductor substrate 1, and source/drain regions 13a, 13b that form a pair by sandwiching the channel region under the gate structure.

As the gate insulating film 11, a silicon oxide film and the like may be used. Further, as the gate electrode 12, a polycrystalline silicon film or a conductive material such as TaN, TiN, Pt, Au, Ru, Ir, TaSiN, WN, HfN and the like may be used.

The source/drain regions 13a, 13b are configured of diffusion layers with which impurities of a predetermined conductivity type are doped at a high concentration to the semiconductor substrate 1. The selection transistor Tr of the first embodiment is an n channel type transistor, and the source/drain regions 13a, 13b are formed by n type diffusion layers. The source/drain regions 13a, 13b are configured of the diffusion layers with which n type impurities, for example P or As and the like, are doped at about $10^{-19}$ to $10^{-21}$ cm$^{-3}$. The diffusion layer 13a is connected to a control circuit such as a sense amplifier, a decoder and the like via a contact and the like.

A variable resistive element (memory cell) MC is connected to the drain region 13b of the selection transistor Tr via a contact 31. The memory cell MC has a structure in which a variable resistive layer 41 and an upper electrode 42 are stacked. As the variable resistive layer 41, a material such as TaO$_x$, AlO$_x$, AlON, HfO$_x$, HfON, TiO$_x$, TiON, ZrO$_x$, LaO$_x$, YO$_x$, SrTiO$_3$, ZnMn$_2$O$_4$, NiO, SrZrO$_3$, Pr$_{0.7}$Ca$_{0.3}$MnO$_3$ and the like with which a transition from a low resistance state to a high resistance state, and a transition from the high resistance state to the low resistance state are carried out by applying voltages with different polarities may be used. Further, as the upper electrode 42, a conductive material such as TaN, TiN, Pt, Au, Ru, Ir, TaSiN, WN, HfN and the like may be used. The upper electrode 42 is connected to the control circuit of the sense amplifier, the decoder and the like.

In the nonvolatile memory device of the first embodiment, a diffusion layer 21 with which impurities are doped at a high concentration is formed in a region in the semiconductor substrate 1 that is lower than the source/drain regions 13a, 13b so that resistivity of the semiconductor substrate 1 can be lowered. In the first embodiment, p type impurities, for example B and the like, are doped to the diffusion layer 21 at about $10^{-19}$ to $10^{-21}$ cm$^{-3}$ so that the source/drain regions 13a, 13b are caused to form a pn junction by this diffusion layer 21.

Further, low concentration diffusion layers 22 with which p type or n type impurities are doped at a low concentration are provided between the source/drain regions 13a, 13b and the diffusion layer 21. The low concentration diffusion layers 22 are formed for example by diffusion layers with which the p type impurities such as B and the like, or the n type impurities such as P or As and the like are doped at about $10^{-13}$ to $10^{-14}$ cm$^{-3}$. Accordingly, by providing the low concentration diffusion layers 22 between the source/drain regions 13a, 13b and the diffusion layer 21, leak current between the source/drain regions 13a, 13b and the semiconductor substrate 1 (diffusion layer 21) upon a reverse bias can be reduced.

Notably, an interlayer insulating film that is not illustrated is formed on the semiconductor substrate 1 on which the selection transistor Tr and the memory cell MC are formed.

Figure 2:
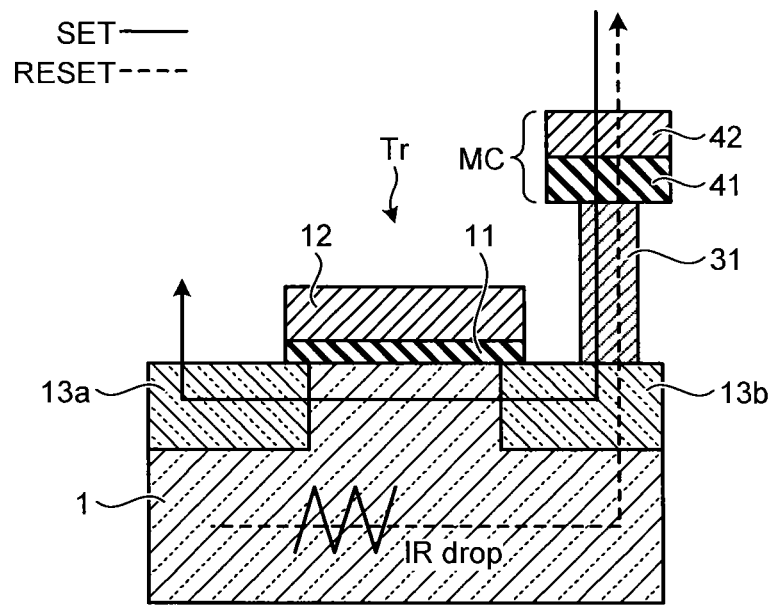
FIG. 2 is a cross sectional view schematically illustrating an example of a configuration of a nonvolatile memory device according to a comparative example.

Next, an operation of the 1T1R type memory cell structure as above will be described. FIG. 2 is a cross sectional view schematically illustrating an example of a configuration of a nonvolatile memory device according to a comparative example. Components identical to FIG. 1 are given identical reference notes. In a general 1T1R type memory cell structure, the diffusion layer 21 and the low concentration diffusion layers 22 as in FIG. 1 are not formed in the region lower than the source/drain regions 13a, 13b.

In a set process of such a memory cell MC, a voltage is applied to the selection transistor Tr (caused to be in an ON state), and further a voltage for writing is applied to the source region 13a of the selection transistor Tr so that the upper electrode 42 becomes positive. At this occasion, 0 V may be applied to the semiconductor substrate 1 (diffusion layer 21 in case of Fig.1). Due to this, a voltage is applied to the variable resistive layer 41, and the variable resistive layer 41 in the high resistance state transitions to the low resistance state. A current path during the set process is illustrated by a solid line in the drawings. At this occasion, the source/drain regions 13a, 13b and the diffusion layer 21 come to be in a reverse bias state.

Further, in a reset process, a voltage is not applied to the selection transistor Tr (caused to be in an OFF state), and a voltage is applied to the upper electrode 42 so that a semiconductor substrate 1 side becomes positive. Due to this, current flows in the variable resistive layer 41 in the low resistance state, resistance is increased by one or two orders by Joule heating, and the variable resistive layer 41 in the low resistance state transitions to the high resistance state. A current path during the reset process is illustrated by a dotted line in the drawings.

However, in the nonvolatile memory device according to the comparative example, as illustrated in FIG. 2, upon the reset process, a voltage drop occurs in the semiconductor substrate 1. As a result, a potential difference applied to the variable resistive layer 41 may be small.

On the other hand, in the nonvolatile memory device of the first embodiment, since the diffusion layer 21 is provided in the semiconductor substrate 1 lower than the source/drain regions 13a, 13b, the voltage drop in the semiconductor substrate 1 (diffusion layer 21) at the reset process can be reduced compared to the case in FIG. 2. As a result, net voltage value that can be applied to the variable resistive layer 41 can be increased compared to the case in FIG. 2. Notably, the operation of the set process is similar to the case of FIG. 2.

In the first embodiment, in the 1T1R type memory cell structure in which the memory cell MC is connected to one end of the diffusion layer of the n channel type selection transistor Tr, the diffusion layer 21 with which the p type impurities are doped at a high concentration is provided in the region lower than the source/drain regions 13a, 13b. As a result, the voltage drop at the semiconductor substrate 1 portion upon the reset process is reduced, and the potential difference to be applied to the variable resistive layer 41 can be large.

Further, since the low concentration diffusion layers 22 are provided between the source/drain regions 13a, 13b and the diffusion layer 21, the leak current flowing between the source/drain regions 13a, 13b and the semiconductor substrate 1 (diffusion layer 21) at the set process can be reduced.

(Second Embodiment)

Figure 3:
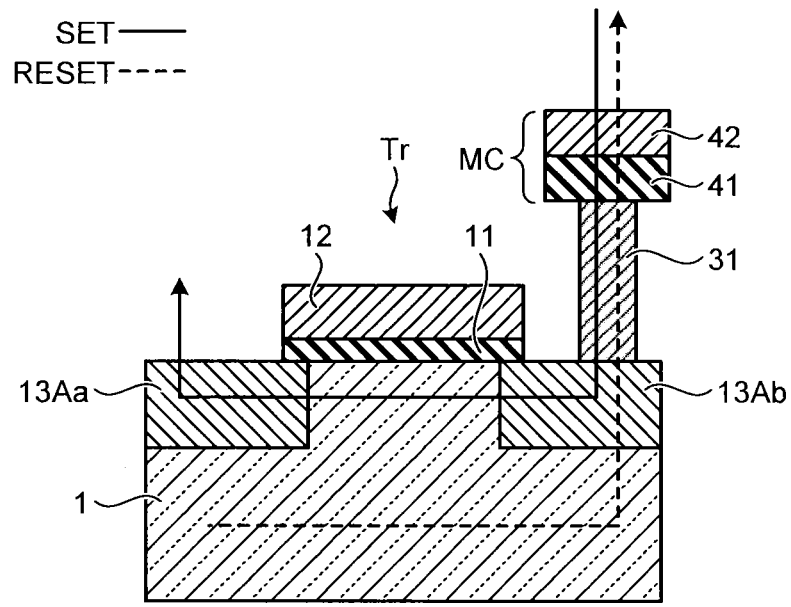
FIG. 3 is a cross sectional view schematically illustrating an example of a configuration of a nonvolatile memory device of a second embodiment.

FIG. 3 is a cross sectional view schematically illustrating an example of a configuration of a nonvolatile memory device of a second embodiment. A memory cell structure of a 1T1R type includes a selection transistor Tr disposed above a semiconductor substrate 1 such as a silicon substrate and the like.

The selection transistor Tr includes a gate structure in which a gate insulating film 11 and a gate electrode 12 are stacked on a channel region of the semiconductor substrate 1, and source/drain regions 13Aa, 13Ab that form a pair by sandwiching the channel region under the gate structure.

As the gate insulating film 11, a silicon oxide film and the like may be used. Further, as the gate electrode 12, a polycrystalline silicon film or a conductive material such as TaN, TiN, Pt, Au, Ru, Ir, TaSiN, WN, HfN and the like may be used.

Further, the source/drain regions 13Aa, 13Ab are configured of full silicide. The source/drain regions 13Aa, 13Ab are configured for example of TiSi$_2$, CoSi$_2$, NiSi and the like. The diffusion layer 13Aa is connected to a control circuit such as a sense amplifier, a decoder and the like via a contact and the like.

A variable resistive element (memory cell) MC is connected to the drain region 13Ab of the selection transistor Tr via a contact 31. The memory cell MC has a structure in which a variable resistive layer 41 and an upper electrode 42 are stacked. For the variable resistive layer 41 and the upper electrode 42, materials similar to the first embodiment may be used. The upper electrode 42 is connected to the control circuit of the decoder and the like.

Notably, an interlayer insulating film that is not illustrated is formed on the semiconductor substrate 1 on which the selection transistor Tr and the memory cell MC are formed.

Figure 4:
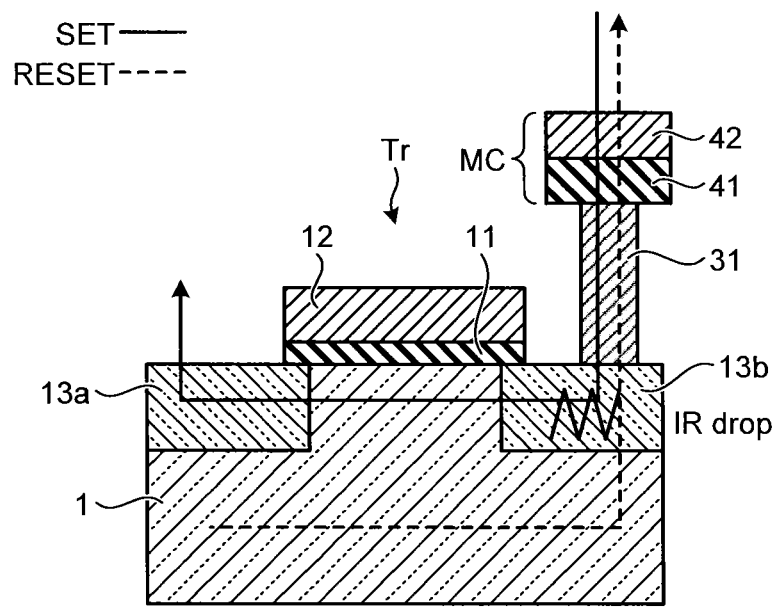
FIG. 4 is a cross sectional view schematically illustrating an example of a configuration of a nonvolatile memory device according to a comparative example.

Next, an operation of the 1T1R type memory cell structure as above will be described. FIG. 4 is a cross sectional view schematically illustrating an example of a configuration of a nonvolatile memory device according to a comparative example. The configuration of the nonvolatile memory device is identical to that illustrated in FIG. 2, thus descriptions thereof will be omitted.

In a set process of such a memory cell MC, a voltage is applied to the selection transistor Tr (caused to be in an ON state), and further a voltage for writing is applied to the source region 13a of the selection transistor Tr so that the upper electrode 42 becomes positive. At this occasion, 0 V can be applied to the semiconductor substrate 1. Due to this, a voltage is applied to the variable resistive layer 41, and the variable resistive layer 41 in the high resistance state transitions to the low resistance state. A current path during the set process is illustrated by a solid line in the drawings. At this occasion, the source/drain regions 13a, 13b and the diffusion layer 21 come to be in a reverse bias state.

However, in the nonvolatile memory device with the structure according to the comparative example, as illustrated in FIG. 4, at the set process, a voltage drop occurs in the source/drain regions 13a, 13b. As a result, a potential difference applied to the variable resistive layer 41 had been reduced thereby.

On the other hand, in the nonvolatile memory device of the second embodiment, since the source/drain regions 13Aa, 13Ab configured of full silicide are provided, the voltage drop at the source/drain regions 13Aa, 13Ab at the set process can be reduced compared to the case of FIG. 4. As a result, voltage value that can be applied to the variable resistive layer 41 becomes large compared to the case in FIG. 4. Notably, the operation of the reset process is similar to the case of FIG. 2.

In the second embodiment, in the 1T1R type memory cell structure in which the memory cell MC is connected to one end of the diffusion layer of the selection transistor Tr, the source/drain regions 13Aa, 13Ab configured of full silicide are provided. As a result, the voltage drop at the source/drain regions 13Aa, 13Ab upon the set process is reduced, and the potential difference to be applied to the variable resistive layer 41 can be made large.

Further, a Schottky barrier is formed between the source/drain regions 13Aa, 13Ab configured of full silicide and the semiconductor substrate 1, and leak current that flows between the source/drain regions 13Aa, 13Ab and the semiconductor substrate 1 (diffusion layer 21) at the set process can be reduced.

(Third Embodiment)

Figure 5:
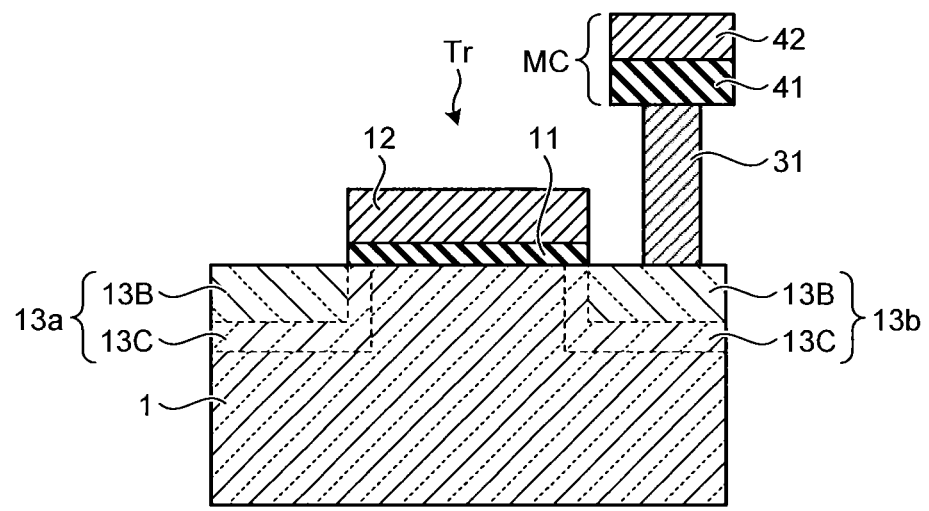
FIG. 5 is a cross sectional view schematically illustrating an example of a configuration of a nonvolatile memory device of a third embodiment.

FIG. 5 is a cross sectional view schematically illustrating an example of a configuration of a nonvolatile memory device of a third embodiment. The nonvolatile memory device of the third embodiment has a structure in which the source/drain regions 13Aa, 13Ab in FIG. 3 of the second embodiment are replaced with source/drain regions 13a, 13b each configured of a high concentration diffusion layer 13B with which impurities of a predetermined conductivity type is doped at a high concentration and a fully silicided layer 13C formed at least at a junction interface of the high concentration diffusion layer 13B and a semiconductor substrate 1. The full silicide layer 13C is provided to form a Schottky barrier between the semiconductor substrate 1 and the source/drain regions 13a, 13b. Notably, other configurations are similar to the second embodiment, so descriptions thereof will be omitted.

In the third embodiment, in a 1T1R type memory cell structure in which a memory cell MC is connected to one end of a diffusion layer of a selection transistor Tr, the source/drain regions 13a, 13b having the high concentration diffusion layers 13B and the full silicide layers 13C formed at the junction interfaces of the high concentration diffusion layers 13B and the semiconductor substrate 1 are provided. As a result, the Schottky barriers are formed between the source/drain regions 13a, 13b and the semiconductor substrate 1, and leak current that flows between the source/drain regions 13a, 13b and the semiconductor substrate 1 (diffusion layer 21) upon the set process can be reduced.

(Fourth Embodiment)

Figure 6A:
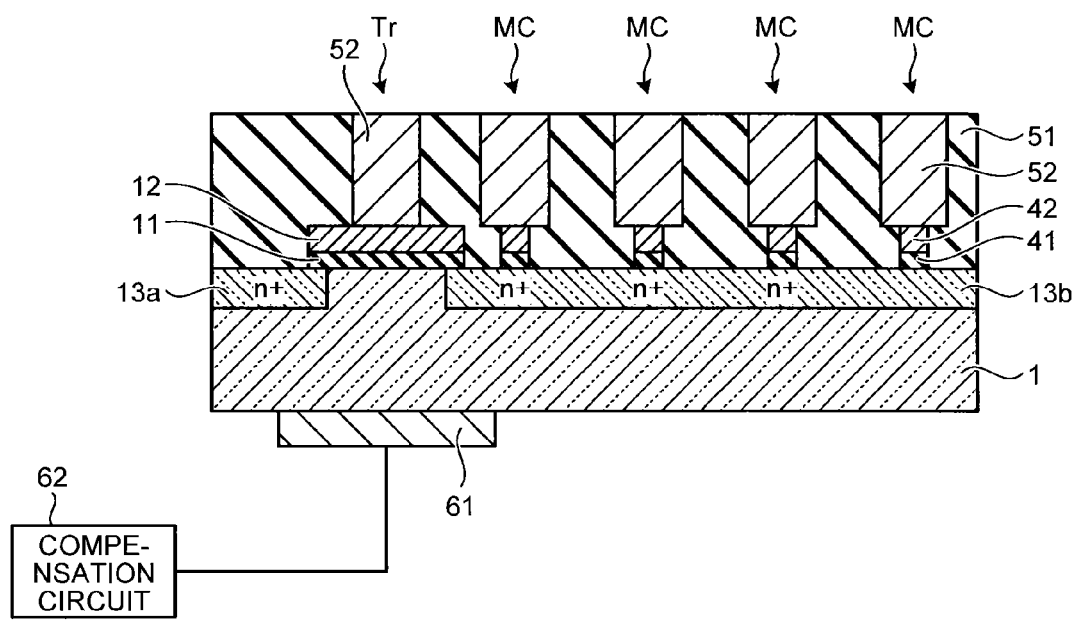
FIG. 6A is a view schematically illustrating an example of a configuration of a nonvolatile memory device of a fourth embodiment.

FIG. 6A is a view schematically illustrating an example of a configuration of a nonvolatile memory device of a fourth embodiment. This nonvolatile memory device has a configuration in which a selection transistor Tr and n pieces (n being a natural number) of variable resistive elements (memory cells) MC are disposed above a semiconductor substrate 1 such as a silicon substrate and the like. Here, each the variable resistive elements MC is commonly connected to a diffusion layer of the selection transistor Tr. That is, the variable resistive elements MC are connected in parallel to one another.

The selection transistor Tr includes a gate structure in which a gate insulating film 11 and a gate electrode 12 are stacked on a channel region of the semiconductor substrate 1, and source/drain regions 13a, 13b that form a pair by sandwiching the channel region under the gate structure.

The source/drain regions 13a, 13b are configured of diffusion layers with which impurities of a predetermined conductivity type are doped at a high concentration to the semiconductor substrate 1. The source/drain regions 13a, 13b can be formed by a diffusion layer with which impurities of a predetermined conductivity type are doped at about $10^{-19}$ to $10^{-21}$ cm$^{-3}$. Further, the drain region 13b has a structure that is elongated in a channel length direction compared to the source region 13a.

The n pieces of memory cells MC are connected to the drain region 13b of the selection transistor Tr. Accordingly, the memory cells MC are commonly connected in parallel to the drain region 13b of one selection transistor Tr will be referred to as an AA string.

Each memory cell MC has a structure in which a variable resistive layer 41 and an upper electrode 42 are stacked. By connecting the memory cells MC directly to the drain region 13b of the semiconductor substrate 1, a gate insulating film 11 of the selection transistor Tr and the variable resistive layers 41 of the memory cells MC can be made of same material, and further, a gate electrode 12 of the selection transistor Tr and the upper electrodes 42 of the memory cells MC can be made of same material.

An interlayer insulating film 51 is formed on the semiconductor substrate 1 on which the selection transistor Tr and the memory cells MC are formed. Further, contacts 52 are connected to the gate electrode 12 of the selection transistor Tr, and to the upper electrode 42 of the respective memory cells MC.

Here, as the gate insulating film 11 and the variable resistive layers 41, a material such as $TaO_x$, $AlO_x$, AlON, $HfO_x$, HfON, $TiO_x$, TiON, $ZrO_x$, $LaO_x$, $YO_x$, $SrTiO_3$, $ZnMn_2O_4$, NiO, $SrZrO_3$, $Pr_{0.7}Ca_{0.3}MnO_3$ and the like with which a transition from a low resistance state to a high resistance state, and a transition from the high resistance state to the low resistance state are carried out by applying voltages with different polarities may be used. Further, as the gate electrode 12 and the upper electrodes 42, a conductive material such as TaN, TiN, Pt, Au, Ru, Ir, TaSiN, WN, HfN and the like may be used.

For example, as a variable resistive material, Si that is in a polycrystalline or amorphous state, or SiO, SiON, SiN, Ge, SiGe, GaAs, InP, GaP, GaInAsP, GaN, SiC, HfSiO and the like may be used. Further, as the variable resistive material, a stacked film of the aforementioned materials may be used. Further, as an electrode of the variable resistive material, for example, an electrode of Ag, Ti, Ni, Co, Al, Fe, Cr, Cu, W, Hf, Ta, Pt, or Zr, or nitrides thereof, or carbides thereof and the like may be arranged. Further, as the electrode, a material in which the above material is added to polycrystalline silicon may be used. Further, a stopper layer of TaSiN may be inserted on an opposite side from the electrode of the variable resistive material.

Further, a back surface electrode 61 is provided on a lower surface of the semiconductor substrate 1 (on a surface on a side on which the selection transistor Tr and the memory cells MC are not formed), and a compensation circuit 62 that applies a voltage to the semiconductor substrate 1 at a set process is connected to the back surface electrode 61. Notably, FIG. 6A is one example, and other configurations may be employed.

Figure 6B:
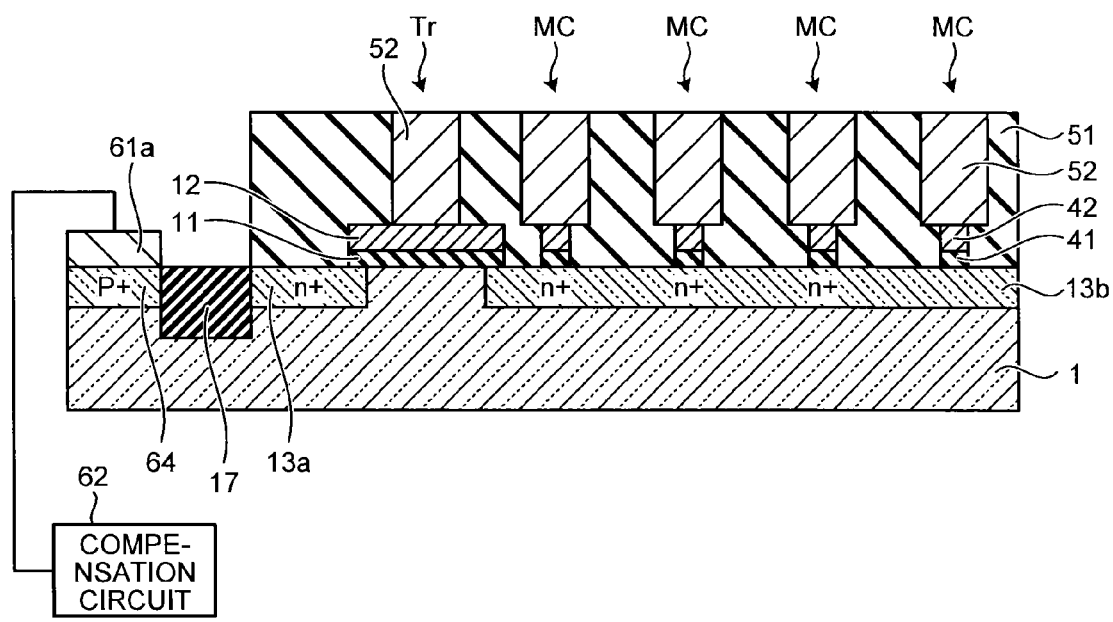
FIG. 6B is a view schematically illustrating another example of a configuration of the nonvolatile memory device of the fourth embodiment.

FIG. 6B is a view schematically illustrating another example of a configuration of the nonvolatile memory device of the fourth embodiment. Instead of the back surface electrode 61 of FIG. 6A, a front surface electrode 61a may be formed on a front surface of the semiconductor substrate 1 (on a side on which the selection transistor Tr and the memory cells MC are formed) as in FIG. 6B. The front surface electrode 61a electrically connects to a p type diffusion layer 64 facing the diffusion layer 13a via an element isolation insulating film 17. The p type diffusion layer 64 is electrically connected to the semiconductor substrate 1.

Figure 7:
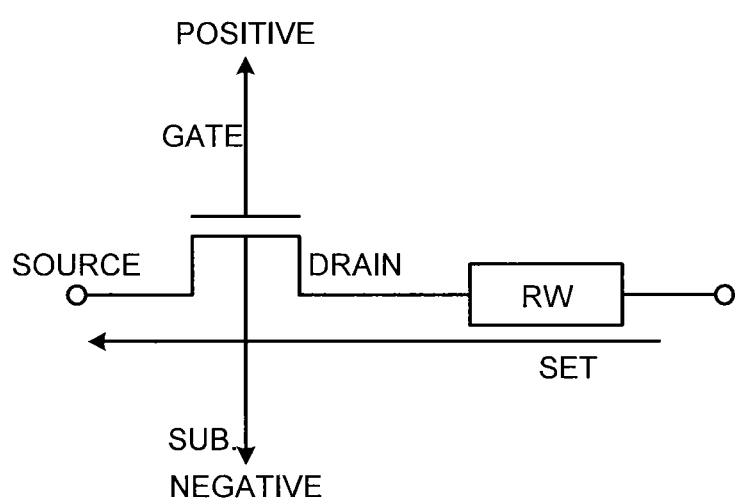
FIG. 7 is a diagram for describing an example of an operation of a compensation circuit of the fourth embodiment.

FIG. 7 is a diagram for describing an operation of the compensation circuit of the fourth embodiment. As described above, at the set operation, a positive voltage is applied to the gate electrode 12 of the selection transistor Tr to become the ON state, and a voltage is applied to the source region 13a so that the upper electrodes 42 of the memory cells MC become positive. However, if the voltage applied to the gate electrode 12 is varied, the selection transistor Tr may not operate as a target IV property. In such a case, the compensation circuit 62 applies a voltage, via the back surface electrode 61, with a polarity that is opposite from the voltage applied to the gate electrode 12. Due to this, the control operation of the selection transistor Tr is stabilized.

In the nonvolatile memory device illustrated in FIG. 6, since the memory cells MC are connected to one selection transistor Tr, the set operation and the reset operation can be performed simultaneously to the memory cells MC connected to the selection transistor Tr.

Next, a method of manufacturing the nonvolatile memory device with such a configuration will be described. FIG. 8A to FIG. 8J are cross sectional views illustrating an example of a procedure of the method of manufacturing the nonvolatile memory device of the fourth embodiment.

Figure 8A:
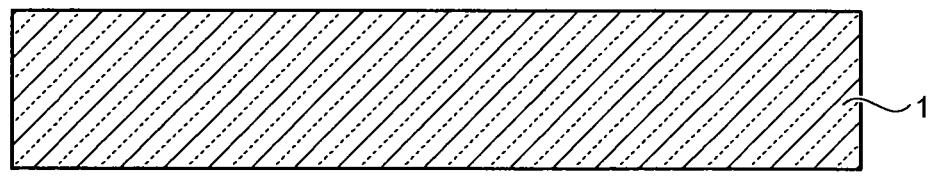
FIG. 8A to FIG. 8J are cross sectional views illustrating an example of a procedure of a method of manufacturing the nonvolatile memory device of the fourth embodiment.
Figure 8B:
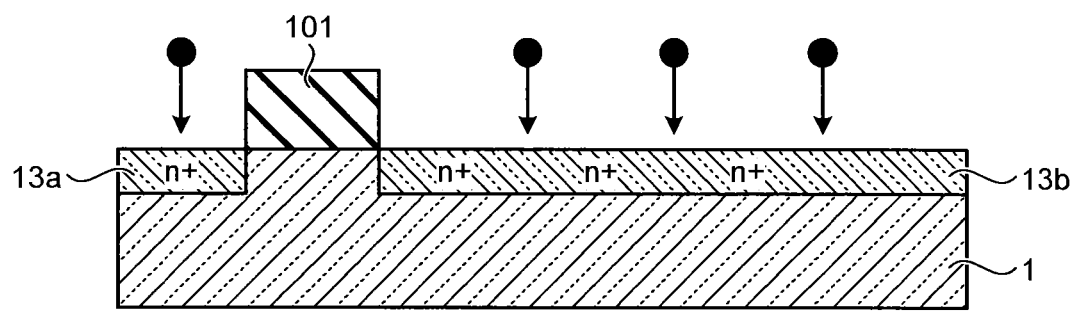
Figure 8C:
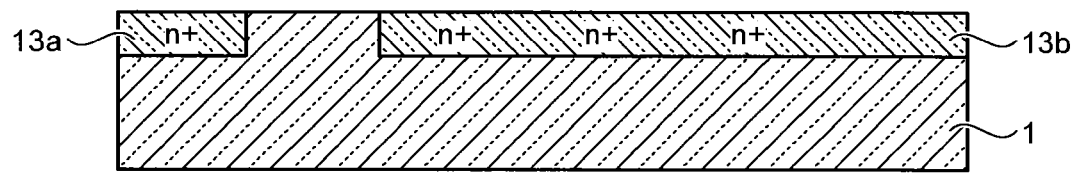

Firstly, as illustrated in FIG. 8A, the semiconductor substrate 1 such as the silicon substrate and the like is prepared. As illustrated in FIG. 8B, a mask layer is formed on one of main surfaces (upper surface) of the semiconductor substrate 1, and a mask pattern 101 having an opening at forming regions of the source/drain regions is formed by using a lithography technique. Then, an etching is performed such as a Reactive Ion Etching (RIE) method and the like. Then, ion implantation is performed using the mask pattern 101 as a mask, and n type impurities such as P or As and the like are implanted at a high concentration in the vicinity of a surface of the upper surface of the semiconductor substrate 1, are activated by heat treatment, whereby the source/drain regions 13a, 13b are formed. Thereafter, as illustrated in FIG. 8C, the mask pattern 101 is removed.

Figure 8D:
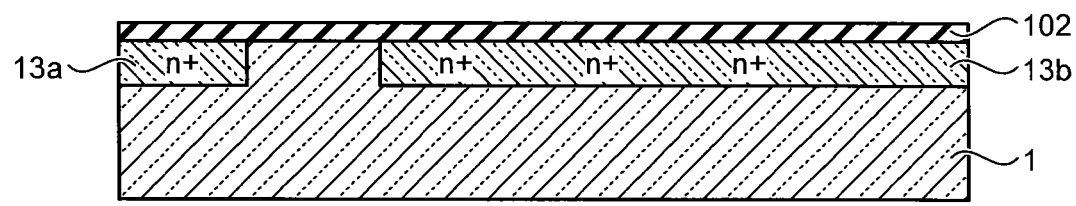

Then, as illustrated in FIG. 8D, a gap filler material 102 is formed on the upper surface of the semiconductor substrate 1. A thickness of the gap filler material 102 is substantially identical to a thickness of the gate insulating film 11 and the variable resistive layers 41 to be formed later. As the gap filler material 102, for example, a silicon oxide film and the like may be used.

Figure 8E:
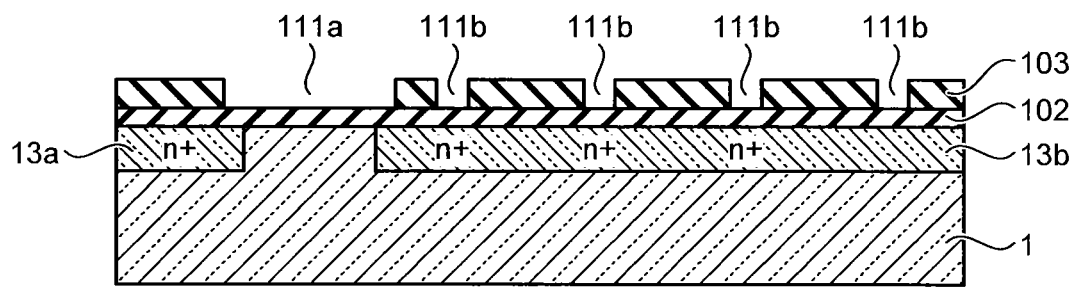

Thereafter, as illustrated in FIG. 8E, a mask layer is formed above the gap filler material 102, and a mask pattern 103 having an opening portion 111a provided at a gate structure forming position of the selection transistor Tr and opening portions 111b provided at forming positions of the memory cells MC is formed by using the lithography technique. Then, the etching technique is performed such as the RIE method and the like.

Figure 8F:
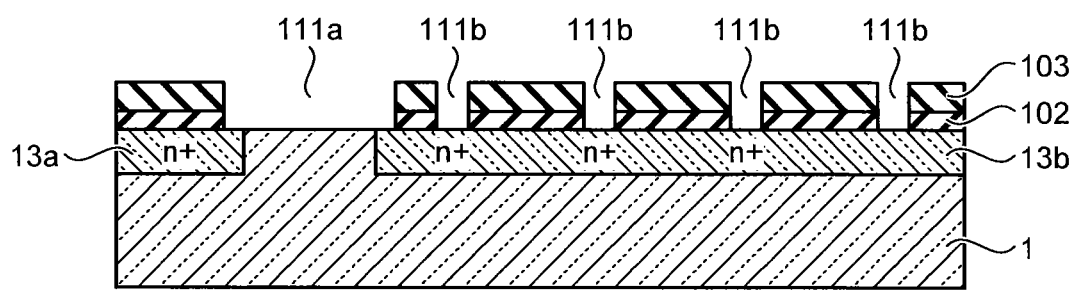

Then, as illustrated in FIG. 8F, the gap filler material 102 is processed by using the etching technique such as the RIE method and the like with the mask pattern 103 as a mask. Due to this, opening portions 111a, 111b are formed to penetrate the stacked film of the gap filler material 102 and the mask pattern 103.

Figure 8G:
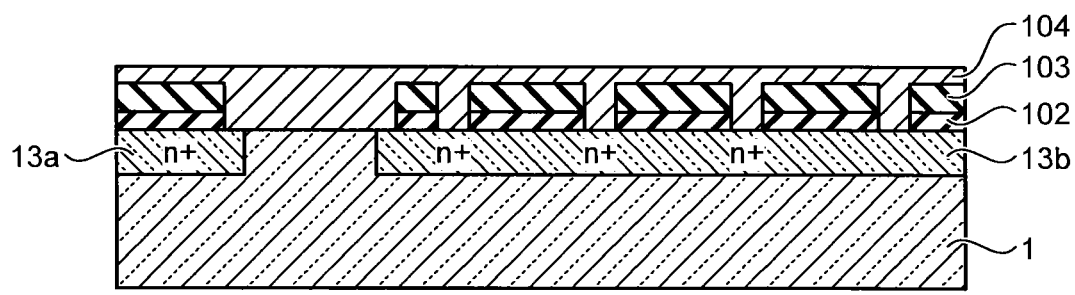

After the etched surface is cleaned, as illustrated in FIG. 8G, a metal oxide film 104 that is to be a gate insulating film of the selection transistor Tr and variable resistive layers of the memory cells MC is formed above the semiconductor substrate 1. The metal oxide film 104 is formed so as to embed in the opening portions 111a, 111b. As the metal oxide film 104, $TaO_x$, $AlO_x$, $AlON$, $HfO_x$, $HfON$, $TiO_x$, $TiON$, $ZrO_x$, $LaO_x$, $YO_x$, $SrTiO_3$, $ZnMn_2O_4$, $NiO$, $SrZrO_3$, $Pr_{0.7}Ca_{0.3}MnO_3$ and the like may be used.

Figure 8H:
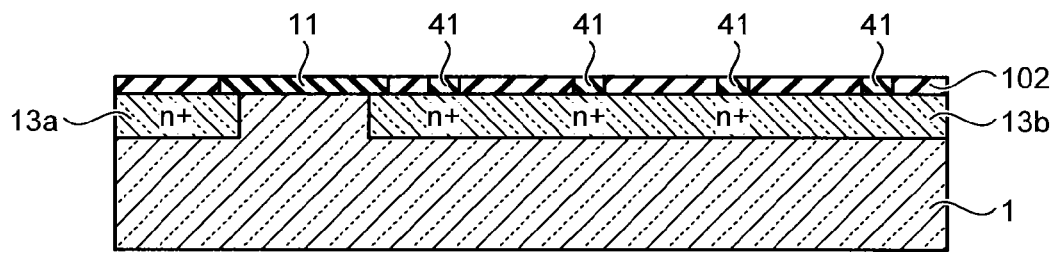

Thereafter, as illustrated in FIG. 8H, an upper surface of the metal oxide film 104 is planarized and polished using the gap filler material as a stopper by a Chemical Mechanical Polishing (CMP) method. Due to this, the gate insulating film 11 configured of the metal oxide film 104 is formed in a forming region of the selection transistor Tr, and the variable resistive layers 41 configured of the metal oxide film 104 are formed in the forming regions of the memory cells MC.

Figure 8I:
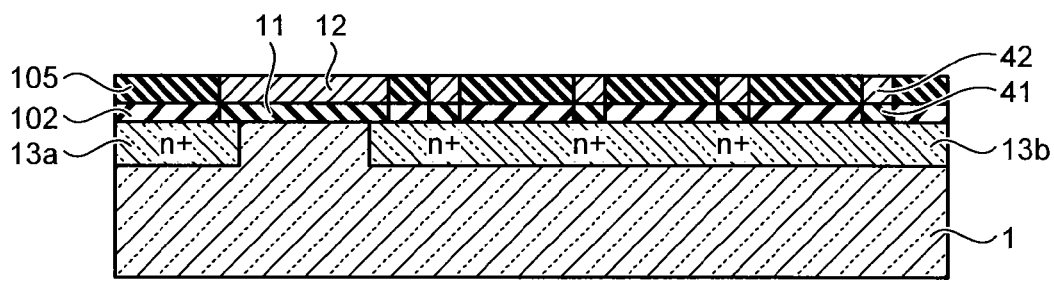

Then, as illustrated in FIG. 8I, the gate electrode 12 is formed above the gate insulating film 11, and the upper electrodes 42 are formed above the variable resistive layers 41. The formation of the gate electrode 12 and the upper electrodes 42 can be performed in a similar procedure as the formation of the gate insulating film 11 and the variable resistive layers 41 as illustrated in FIG. 8D to FIG. 8H. That is, a gap filler material 105 is formed above the gate insulating film 11, the variable resistive layers 41, and the gap filler material 102, and opening portions are formed at forming positions of the gate electrode 12 and the upper electrodes 42. The opening portions are provided corresponding to the forming positions of the gate insulating film 11 and the variable resistive layers 41. Further, by embedding the opening portions with a conductive material such as TaN, TiN, Pt, Au, Ru, Ir, TaSiN, WN, HfN and the like, the gate electrode 12 configured of the conductive material is formed in the forming region of the selection transistor Tr, and the upper electrodes 42 configured of the conductive material are formed in the forming regions of the memory cells MC.

Figure 8J:
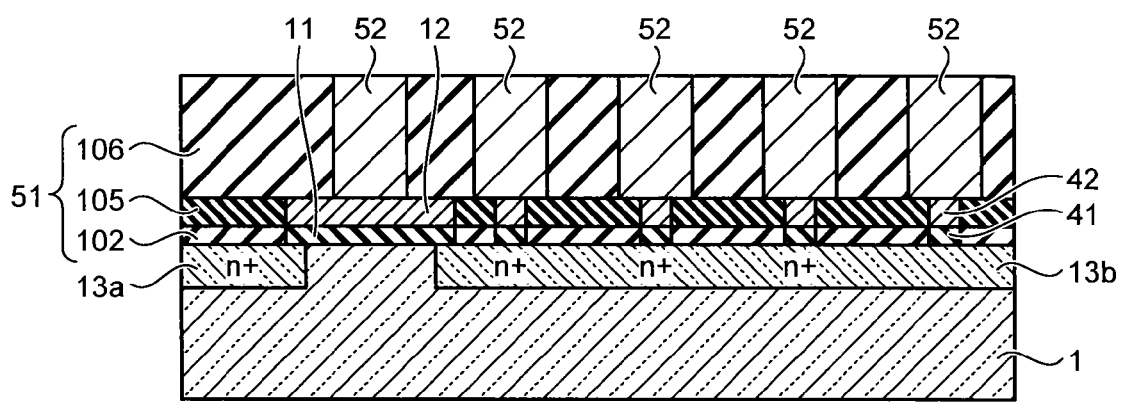

Thereafter, as illustrated in FIG. 8J, the contacts 52 are formed above the gate electrode 12 and above the upper electrodes 42. The formation of the contacts 52 can be performed in a similar procedure as the formation of the gate insulating film 11 and the variable resistive layers 41 as illustrated in FIG. 8D to FIG. 8H. That is, a gap filler material 106 is formed on the gate electrode 12, the upper electrodes 42, and the gap filler material 105, and opening portions are formed at forming positions of the contacts 52. The opening portions are provided corresponding to the forming positions of the gate electrode 12 and the upper electrodes 42. Further, the contacts 52 are formed by embedding a conductive material such as W and the like in the opening portions. Notably, the interlayer insulating film 51 is formed by the gap filler materials 102, 105, 106 formed in FIG. 8D to FIG. 8J being integrated.

Further by forming the back surface electrode 61 at a back surface of the semiconductor substrate 1, the nonvolatile memory device with the structure illustrated in FIG. 6A is formed.

Notably, the structure of the source/drain regions 13a, 13b of the selection transistor Tr may employ ones described in the first to third embodiments.

In the fourth embodiment, the back surface electrode 61 is provided at the back surface of the semiconductor substrate 1, and the compensation circuit 62 is connected to the back surface electrode 61; thus, it is possible to adjust the threshold voltage upon operating the selection transistor Tr easily.

Further, since the memory cells MC are connected in parallel to one selection transistor Tr, it is possible to perform the reset operation (erasing process) to the memory cells MC at the same time.

(Fifth Embodiment)

Figure 9:
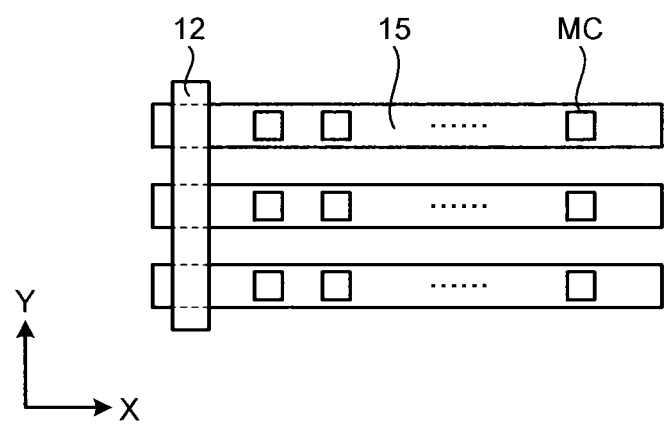
FIG. 9 is a planar view schematically illustrating an example of an arrangement relationship of a gate electrode and source/drain regions of a selection transistor of a fifth embodiment.

FIG. 9 is a planar view schematically illustrating an example of an arrangement relationship of a gate electrode and source/drain regions of a selection transistor of a fifth embodiment. In FIG. 9, an arranged direction of memory cells MC formed in parallel in source/drain regions of one selection transistor Tr will be an X direction, and a direction crossing to the X direction will be a Y direction.

As illustrated in FIG. 9, AA strings 15 in each of which memory cells MC are arranged in the X direction in the source/drain regions of the one selection transistor Tr is arranged in the Y direction at a predetermined interval. Further, in the vicinity of one ends of the AA strings 15, a gate electrode 12 extending in the Y direction is arranged. The selection transistor Tr is formed at each of intersections of the AA strings 15 and the gate electrode 12. The gate electrode 12 is commonly connected among the selection transistors Tr arranged in the Y direction. The memory cells MC are arranged on each AA string 15. As a result, a degree of integration of the memory cells MC can be high.

Accordingly, a memory cell array including the selection transistors Tr and the AA strings 15 is arranged above the semiconductor substrate 1 in a two-dimensional manner.

Figure 10:
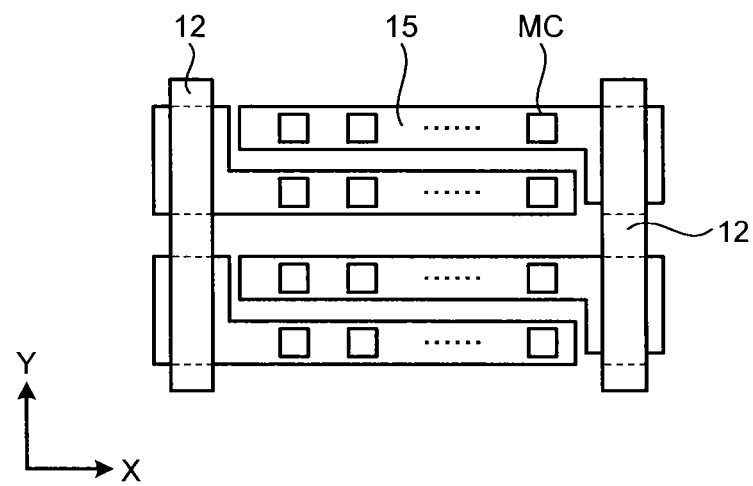
FIG. 10 is a planar view schematically illustrating another example of the arrangement relationship of the gate electrode and source/drain regions of the selection transistor of the fifth embodiment.

FIG. 10 is a planar view schematically illustrating another example of the arrangement relationship of the gate electrode and source/drain regions of the selection transistor of the fifth embodiment. In the example illustrated in FIG. 9, a channel width of the selection transistors Tr (width in the Y direction) is substantially equal to a width of the AA strings 15 (width in the Y direction). Thus, as illustrated in FIG. 10, the channel width of the selection transistors Tr can be broader than the width of the AA strings 15. As a result, current flowing in the selection transistors Tr can be larger.

Further, the AA strings 15 may be configured in a substantially L shape, and two AA strings 15 are configured as a pair, and are arranged in a point symmetry. This is possible to suppress an increase in an area of the memory cell array caused by the increase in the dimension of the gate electrode 12 as above in the Y direction. Here, a width of a pair of AA strings 15 in the Y direction is substantially equal to a width of each AA string 15 at its broad portion of the L shape. That is, the broad portion of the L shape is arranged at both ends of the pair of AA strings 15. Further, a narrow portion of one of the AA strings 15 is arranged so that its extension in the X direction is stopped by the broad portion of the other of the AA strings 15. Here, the gate electrodes 12 extending in the Y direction are arranged the broad portions of the L shape of the AA strings 15. As a result, arranged positions of the selection transistors Tr change for every other string in the Y direction. For example, with the first, third, . . ., 2n−1 th AA strings 15 (n being a natural number) from an upper side in FIG. 10, the gate electrode 12 extending in the Y direction is arranged on a right side in the X direction, and the selection transistors Tr are arranged at the intersections of this gate electrode 12 and the broad portions of the L shape of the AA strings 15. Further, with the second, fourth, . . ., 2nth AA strings 15, the gate electrode 12 extending in the Y direction is arranged on a left side in the X direction, and the selection transistors Tr are arranged at the intersections of this gate electrode 12 and the broad portions of the L shape of the AA strings 15. Further, an arranged position in the Y direction of the selection transistor Tr of the 2k−1th AA string 15 (k being a natural number from 1 to n) and an arranged position in the Y direction of the selection transistor Tr of the 2kth AA string 15 are arranged to overlap one another. Further, an arranged position in the Y direction of the 2k−1th selection transistor Tr and an arranged position in the Y direction of the 2kth AA string 15 are arranged not to overlap one another.

In the fifth embodiment, in the AA strings 15 arranged in the Y direction, the selection transistor Tr is arranged at one end of the AA string 15 for the 2k−1th string from the upper side, and the selection transistor Tr is arranged at the other end of the AA string 15 for the 2kth string, and the channel width of the selection transistors Tr (gate width) is broadened than the width of the AA strings 15 in the Y direction. Further, the 2k−1th and 2kth AA strings 15 are arranged so as not to overlap within a range of the channel width of the selection transistors Tr. Due to this, the channel width of the selection transistors Tr can be broadened without the significant increase in the area of the memory cells MC, and further it is possible to increase an amount of current to be supplied to variable resistive layers.

(Sixth Embodiment)

Figure 11A:
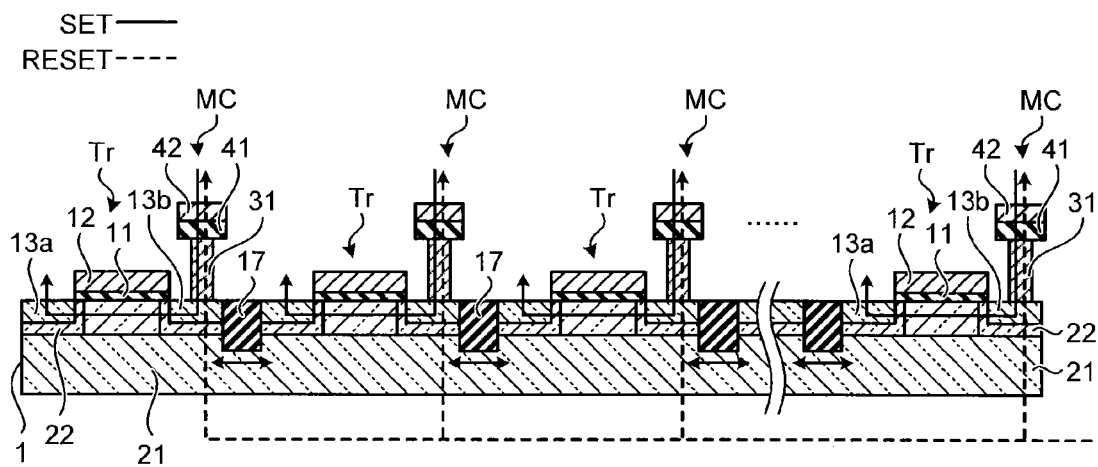
FIG. 11A and FIG. 11B are cross sectional views schematically illustrating an example of a structure of a nonvolatile memory device of a sixth embodiment.
Figure 11B:
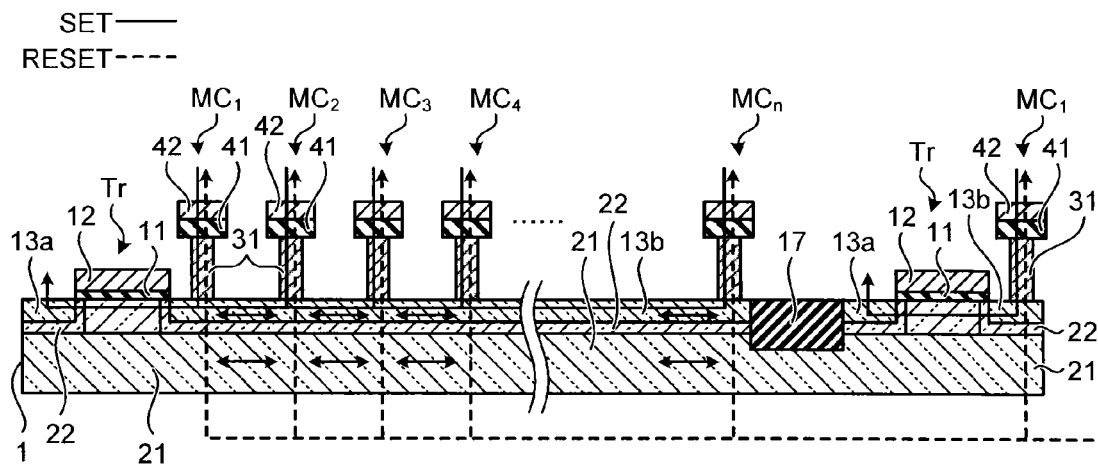

FIG. 11A and FIG. 11B are cross sectional views schematically illustrating a structure of a nonvolatile memory device of a sixth embodiment. FIG. 11A is a cross sectional view schematically illustrating an example of a case of arranging 1T1R type memory cell structures with a structure illustrated in FIG. 1 of the first embodiment in a matrix on a semiconductor substrate 1. In this case, an interval between the 1T1R type memory cell structures is isolated by an element isolation insulating film 17. A position of a lower surface of the element isolation insulating film 17 is at a deeper position than forming positions of low concentration diffusion layers 22, however, it does not penetrate the semiconductor substrate 1 in a thickness direction. That is, the semiconductor substrate 1 is shared the memory cell structures. Due to this, by applying a voltage to the semiconductor substrate 1, the reset operation can be performed for memory cells MC arranged in a matrix at the same time.

Further, FIG. 11B is a structure in which diffusion layers (source/drain regions 13a, 13b) of the respective memory cells MC in FIG. 11A are further shared; n memory cells MC (n being a natural number of 2 or more) are connected to one selection transistor Tr similar to FIG. 6. Further, the element isolation insulating film 17 is arranged to isolate the 1TnR type memory cell structure. In this structure, similar to the structure of FIG. 11A, the reset operation can be performed to the memory cells MC arranged on the semiconductor substrate 1 at the same time. And a bit number per unit area can be increased compared to the FIG. 11A.

Notably, similar to FIG. 1, the memory cells MC of FIG. 11B have a structure of being arranged on the source/drain region 13b of the selection transistor Tr via contacts 31, however, they may have a structure of being directly arranged on the source/drain region 13b of the selection transistor Tr as in FIG. 6 (without intervening the contacts 31). Further, a diffusion layer 22 is arranged contiguously below the drain region 13b.

In the sixth embodiment, advantageous effects similar to the first embodiment can be achieved. Further, since the memory cells MC are arranged above the semiconductor substrate 1, and the semiconductor substrate 1 is shared the memory cells MC. So it is possible to perform a reset (erasing) operation to the memory cells MC at the same time.

(Seventh Embodiment)

Figure 12:
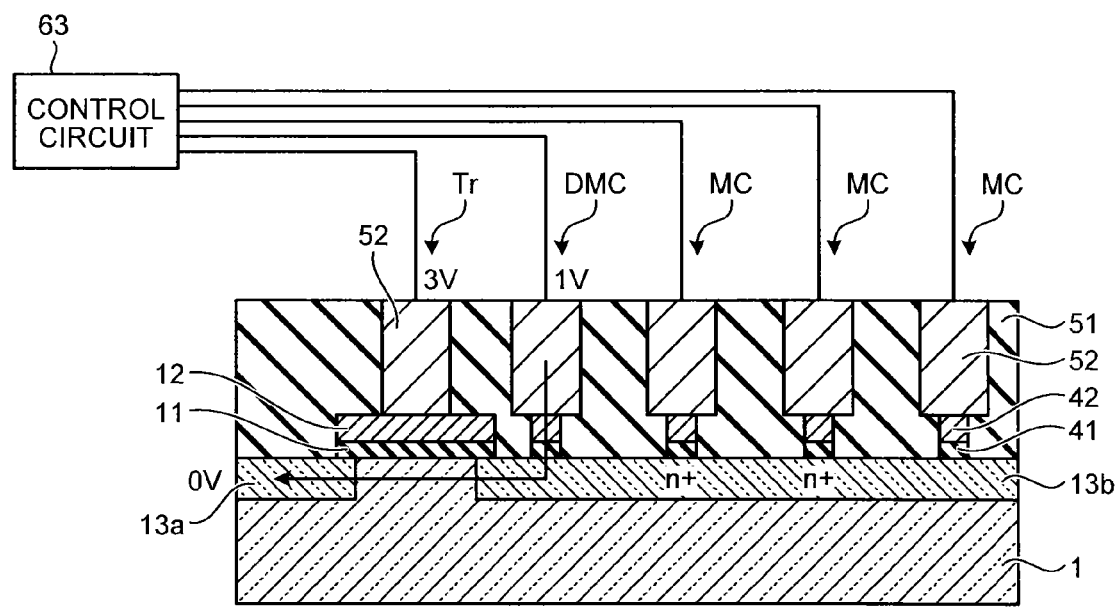
FIG. 12 is a view schematically illustrating an example of a structure of a nonvolatile memory device of a seventh embodiment.

FIG. 12 is a view schematically illustrating an example of a structure of a nonvolatile memory device of a seventh embodiment. This nonvolatile memory device is almost structurally identical to one illustrated in FIG. 6A. However, in the seventh embodiment, a memory cell arranged adjacent to a selection transistor Tr among memory cells MC of an AA string connected to the selection transistor Tr is used as a dummy memory cell (hereinbelow referred to as a dummy cell) DMC.

Notably, components identical to FIG. 6A are given identical reference notes, and descriptions thereof will be omitted.

Further, in a case of inhibiting use of the AA string (inhibit AA string) due to a reason that a bit error and the like exists, the dummy cell DMC of the AA string can be used as a use inhibit-information storage region. Specifically, in the case of the inhibit AA string, a variable resistive layer 41 of the dummy cell DMC is electrically broken down completely. That is, the use inhibit-information storage region is in a state of being disconnected by the variable resistive layer 41 having been electrically broken down in a case of the inhibit AA string. On the other hand, when a value of current that is equal to or more than a predetermined threshold flows in the AA string, the AA string is available.

A control circuit 63 applies a predetermined bias voltage to the use inhibit-information storage region upon a set/reset/read operation, determines whether the current that is equal to or more than the predetermined threshold flows or not. Then, if the current flows, a control circuit 63 controls so as to perform at the set/reset/read operation to the AA string. If the current does not flow, a control circuit 63 does not to perform the write process to the AA string.

Next, an example of the write method of storing the use inhibit-information in the nonvolatile memory device as above will be described. After having manufactured the nonvolatile memory device, a test is performed on the memory cells MC configuring the AA strings, and a determination is made as to whether having a bit error or not. If a bit error exists, a high voltage is applied to the dummy cell DMC of the AA string in which the bit error exists, and the variable resistive layer 41 is electrically broken down. If no bit error exists, the variable resistive layer 41 of the dummy cell DMC is caused to be in the state in which the current that is equal to or more than the predetermined threshold flows. For example, a resistant value of the dummy cell DMC is caused to be in a low resistance state. According to the above, the use inhibit-information is stored to the dummy cell DMC.

Next, an example of a method of determination whether AA string being available or not will be described. Firstly, when a data write/read instruction is given, the control circuit 63 reads the use inhibit-information from the dummy cell DMC of the AA string that is a write/read target. For example, as illustrated in FIG. 12, with respect to a source region 13a of the selection transistor Tr, a voltage for example of 3 V is applied to a gate electrode 12 and a voltage for example of 1 V is applied to an upper electrode 42 of the dummy cell DMC. Due to this, the selection transistor Tr turns on. Then, by the voltage applied to the dummy cell DMC, the determination whether the current that is equal to or more than the predetermined threshold flows in the dummy cell DMC or not. For example, a sense amplifier and the like is connected to the source region 13a, and the determination is made as to whether a current that is equal to or more than a threshold has flown or not is made by this sense amplifier. If the current that is equal to or more than the predetermined threshold flows, the AA string provided with the dummy cell DMC is available for use, and the instructed data is written thereto. Further, if the current that is equal to or more than the predetermined threshold does not flow, the AA string provided with the dummy cell DMC is prohibited of its use, so the data write is not performed on the AA strings.

Notably, the structure of the source/drain regions 13a, 13b of the selection transistor Tr may employ ones described in the first to third embodiments.

In the seventh embodiment, in the nonvolatile memory device having the structure in which the selection transistors Tr are arranged in the AA strings, the memory cell arranged adjacent to the selection transistor Tr is used as the dummy cell DMC, and the variable resistive layer 41 of the dummy cell DMC is electrically broken down where the bit error exists in the AA string. Further, at the data write/read, a voltage is applied to the dummy cell DMC, and the determination on whether the current that is equal to or more than the predetermined threshold flows or not is performed, and the data write/read to the AA string is not performed in the case where the current that is equal to or more than a predetermined value does not flow. Due to this, the data write being performed on the defective bit is avoided, and it is possible to increase performance reliability of the memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
   a selection transistor including a gate electrode provided above a semiconductor substrate via a gate insulating film, and source/drain regions provided on both sides of a surface of the semiconductor substrate, sandwiching the gate electrode, and the source/drain regions diffused impurities of a first conductivity type;
   a memory cell including a variable resistive layer connected to a drain region of the selection transistor and a first electrode that is formed on the variable resistive layer;

a first impurity diffusion layer provided in a region lower than the drain region, and the first impurity diffusion layer having impurities of a second conductivity type; and a second impurity diffusion layer provided between the drain region and the first impurity diffusion layer, and the second impurity diffusion layer having impurities of the first conductivity type or the second conductivity type, and a concentration of the second impurity diffusion layer being lower than that of the first conductivity type in the drain region and that of the second conductivity type in the first impurity diffusion layer.

2. The nonvolatile memory device according to claim 1, wherein
the impurities of the first conductivity type are n type impurities, and
the impurities of the second conductivity type are p type impurities.

3. The nonvolatile memory device according to claim 1, wherein
the second impurity diffusion layer is formed along a boundary of the drain region and the semiconductor substrate.

4. The nonvolatile memory device according to claim 1, wherein
the memory cell is provided above the drain region via a contact.

5. The nonvolatile memory device according to claim 1, wherein
the memory cell includes a structure in which the variable resistive layer and the first electrode are directly stacked on the drain region,
the gate insulating film and the variable resistive layer are formed of a same material, and
the gate electrode and the first electrode are formed of a same material.

6. The nonvolatile memory device according to claim 1, wherein
two or more of the memory cells are provided, and
the memory cells are connected in parallel to one selection transistor.

7. The nonvolatile memory device according to claim 1, wherein
memory cell units disposed above a semiconductor substrate are isolated by an element isolation insulating film without electrically insulating the semiconductor substrate from the memory cell units, and, each memory cell unit including the selection transistor and the memory cell.

8. The nonvolatile memory device according to claim 7, wherein
two or more of the memory cells are provided, and
the memory cells are connected to one selection transistor.

9. The nonvolatile memory device according to claim 7, wherein
two or more of the memory cells are provided, and
the memory cells are connected in parallel to one selection transistor.

10. The nonvolatile memory device according to claim 9, further comprising:
a substrate electrode provided on the semiconductor substrate; and
a compensation circuit being configured to apply a first voltage to the substrate electrode when applying a second voltage to the gate electrode and applying a third voltage to the variable resistive layer, the first voltage having a polarity that is opposite to the second voltage.

11. The nonvolatile memory device according to claim 9, wherein the gate electrodes of the selection transistors that are arranged at a predetermined interval are commonly connected in a direction intersecting an arranged direction of the memory cells in the drain region.

12. The nonvolatile memory device according to claim 9, wherein
the memory cell units include first memory cell units and second memory cell units,
each of the first memory cell units includes a first selection transistor with which the gate electrode is arranged on a first end portion side of the drain region in a first direction along which the memory cells are arranged, a channel width of the gate electrodes of the first selection transistor in a second direction being broader than a width of the drain region in the second direction, and the second direction being orthogonal to the first direction,
each of the second memory cell units includes a second selection transistor with which the gate electrode is arranged on a second end portion side of the drain region in the first direction, a channel width of the gate electrodes of the second selection transistor in the second direction being broader than a width of the drain region in the second direction,
the first memory cell units and the second memory cell units are arranged alternately in the second direction,
the gate electrode of a plurality of the first selection transistors arranged in the second direction commonly connects the first selection transistors, and
the gate electrode of a plurality of the second selection transistors arranged in the second direction commonly connects the second selection transistors.

13. The nonvolatile memory device according to claim 9, wherein
the memory cell arranged adjacent to the selection transistor is a dummy cell, and
the variable resistive layer of the dummy cell is electrically broken down where a bit error exists in the memory cell units.

14. The nonvolatile memory device according to claim 13, further comprising a control circuit, wherein before writing or reading to the memory cells, the control circuit is configured to apply a voltage to the dummy cell, not to perform the writing or reading to the memory cells when a current does not flow in the dummy cell, and to perform the writing or reading to the memory cells when the current flows in the dummy cell.

15. The nonvolatile memory device according to claim 7, wherein the memory cell is provided above the drain region via a contact.

16. The nonvolatile memory device according to claim 7, wherein a junction interface of the source/drain regions of the selection transistor and at least the semiconductor substrate is formed by a full silicide film.

* * * * *